US007687340B2

(12) United States Patent
Adkisson et al.

(10) Patent No.: US 7,687,340 B2
(45) Date of Patent: Mar. 30, 2010

(54) PROTECT DIODES FOR HYBRID-ORIENTATION SUBSTRATE STRUCTURES

(75) Inventors: James William Adkisson, Jericho, VT (US); Jeffrey Peter Gambino, Westford, VT (US); Alain Loiseau, Williston, VT (US); Kirk David Peterson, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 377 days.

(21) Appl. No.: 11/849,489

(22) Filed: Sep. 4, 2007

(65) Prior Publication Data

US 2007/0293025 A1    Dec. 20, 2007

Related U.S. Application Data

(62) Division of application No. 10/908,926, filed on Jun. 1, 2005, now Pat. No. 7,315,066.

(51) Int. Cl.
*H01L 21/8234* (2006.01)
(52) U.S. Cl. ............... 438/198; 438/237; 257/E21.641
(58) Field of Classification Search ............. 438/198, 438/237; 257/E21.641
See application file for complete search history.

(56) References Cited

U.S. PATENT DOCUMENTS

| 5,313,088 | A | 5/1994 | Takahashi et al. |
| 5,548,150 | A | 8/1996 | Omura et al. |
| 5,751,041 | A | 5/1998 | Suzuki et al. |
| 5,869,872 | A | 2/1999 | Asai et al. |
| 5,882,967 | A | 3/1999 | Brown et al. |
| 5,939,767 | A | 8/1999 | Brown et al. |
| 6,489,228 | B1 * | 12/2002 | Vigna et al. .................. 438/612 |
| 6,734,054 | B2 * | 5/2004 | Tang et al. .................. 438/197 |
| 2003/0178648 | A1 | 9/2003 | Bansal |
| 2004/0088658 | A1 | 5/2004 | Minda |

* cited by examiner

*Primary Examiner*—Chandra Chaudhari
(74) *Attorney, Agent, or Firm*—Schmeiser, Olsen & Watts; Michael J. LeStrange (57) ABSTRACT

A semiconductor structure fabrication method. First, a semiconductor structure is provided including (a) a semiconductor block having a first semiconductor material doped with a first doping polarity and having a first lattice orientation, and (b) a semiconductor region on the semiconductor block, wherein the semiconductor region is physically isolated from the semiconductor block by a dielectric region, and wherein the semiconductor region includes a second semiconductor material (i) doped with a second doping polarity opposite to the first doping polarity and (ii) having a second lattice orientation different from the first lattice orientation. Next, first and second gate stacks are formed on the semiconductor block and the semiconductor region, respectively. Then, (i) first and second S/D regions are simultaneously formed in the semiconductor block on opposing sides of the first gate stack and (ii) first and second discharge prevention semiconductor regions in the semiconductor block.

5 Claims, 8 Drawing Sheets

PROTECT DIODES FOR HYBRID-ORIENTATION SUBSTRATE STRUCTURES

BACKGROUND OF THE INVENTION

1. Technical Field

The present invention relates to hybrid-orientation substrate structures, and more specifically, to hybrid-orientation substrate structures with discharge damage prevention features.

2. Related Art

A typical hybrid-orientation substrate may include two different silicon regions (namely first and second silicon regions) having different lattice orientations on the same substrate. For example, the first silicon region may comprise <100> lattice orientation silicon (or in short, <100> silicon), whereas the second silicon region may comprise <110> lattice orientation silicon (or in short, <110> silicon). In one case, the first region may be on and in direct physical contact with the substrate, whereas the second region may be on the same substrate but physically and electrically separated from the first silicon region and the substrate by a dielectric region. Usually, N channel field effect transistors (NFETs) are formed on the first region (comprising <100> silicon), whereas P channel FETs (PFETs) are formed on the second region (comprising <110> silicon). The reason is that NFETs operate faster when formed on <100> silicon than on <110> silicon, while PFETs operate faster when formed on <110> silicon than on <100> silicon.

During the fabrication of the FETs and other structures (e.g., interconnect lines, etc.) on the typical hybrid-orientation substrate, plasma may be involved in some fabrication steps. For example, reactive ion etching (RIE), plasma enhanced chemical vapor deposition (PECVD), metal deposition in a sputter plasma tool, etc. are some example processes that involve the use of a plasma (hereafter, referred to as plasma processes). During these plasma processes, different nodes of the FETs may have different voltage potentials that may result in current discharge that may cause damage to the FETs (namely, discharge damage).

Therefore, there is a need for a hybrid-orientation substrate structure (and a method for forming the same) with discharge prevention features.

SUMMARY OF THE INVENTION

The present invention provides a semiconductor structure, comprising (a) a semiconductor block comprising a first semiconductor material having a first lattice orientation; (b) a semiconductor region on the semiconductor block, wherein the semiconductor region is physically isolated from the semiconductor block by a dielectric region, and wherein the semiconductor region comprises a second semiconductor material having a second lattice orientation different from the first lattice orientation; (c) a first semiconductor transistor formed on the semiconductor region, wherein the first semiconductor transistor comprises (i) first and second source/drain (S/D) regions, (ii) a channel region disposed between the first and second S/D regions, (iii) a gate dielectric region on the channel region, and (iv) a gate region on the gate dielectric region and electrically insulated from the channel region by the gate dielectric region; and (d) a discharge prevention structure in direct physical contact with the semiconductor block and electrically coupled to a first electric node of the first semiconductor transistor; wherein a second electric node of the first semiconductor transistor is electrically coupled to the semiconductor block, and wherein the first and second electric nodes are electrically insulated from each other within the first semiconductor transistor by the gate dielectric region.

The present invention also provides a semiconductor structure, comprising (a) a semiconductor block comprising a first semiconductor material doped with a first doping polarity and having a first lattice orientation; (b) a semiconductor region on the semiconductor block, wherein the semiconductor region is physically isolated from the semiconductor block by a dielectric region, and wherein the semiconductor region comprises a second semiconductor material (i) doped with a second doping polarity opposite to the first doping polarity and (ii) having a second lattice orientation different from the first lattice orientation; (c) a first semiconductor transistor formed on the semiconductor region, wherein the first semiconductor transistor comprises (i) first and second source/drain (S/D) regions, (ii) a first channel region disposed between the first and second S/D regions, (iii) a first gate dielectric region on the first channel region, and (iv) a first gate region on the first gate dielectric region and electrically insulated from the first channel region by the first gate dielectric region; (d) a second semiconductor transistor formed on the semiconductor block, wherein the second semiconductor transistor comprises (i) third and fourth S/D regions, (ii) a second channel region disposed between the third and fourth S/D regions, (iii) a second gate dielectric region on the second channel region, and (iv) a second gate region on the second gate dielectric region and electrically insulated from the second channel region by the second gate dielectric region, and wherein the first gate region is electrically coupled to the third S/D region; (e) a first discharge prevention structure in direct physical contact with the semiconductor block and electrically coupled to the first S/D region; and (f) a second discharge prevention structure in direct physical contact with the semiconductor block and electrically coupled to the second gate region, wherein the first discharge prevention structure comprises a first PN junction which is configured to be reverse-biased during a normal operation of the first semiconductor transistor, and wherein the second discharge prevention structure comprises a second PN junction which is configured to be reverse-biased during a normal operation of the second semiconductor transistor.

The present invention also provides a semiconductor structure fabrication method, comprising providing a semiconductor structure comprising (a) a semiconductor block comprising a first semiconductor material doped with a first doping polarity and having a first lattice orientation; (b) a semiconductor region on the semiconductor block, wherein the semiconductor region is physically isolated from the semiconductor block by a dielectric region, and wherein the semiconductor region comprises a second semiconductor material (i) doped with a second doping polarity opposite to the first doping polarity and (ii) having a second lattice orientation different from the first lattice orientation; forming first and second gate stacks on the semiconductor block and the semiconductor region, respectively, wherein the first and second gate stacks comprises first and second gate regions, respectively; simultaneously forming (i) first and second S/D regions in the semiconductor block on opposing sides of the first gate stack and (ii) first and second discharge prevention semiconductor regions in the semiconductor block, wherein the first and second S/D regions and the first and second discharge prevention semiconductor regions are doped with the second doping polarity; forming third and fourth S/D regions in the semiconductor region on opposing sides of the second gate stack, wherein the third and fourth S/D regions are doped with the first doping polarity; and forming first, second, and third electrically conducting lines, wherein the first electrically conducting line electrically couples the first gate region to the first discharge prevention semiconductor region, wherein the second electrically conducting line electrically couples the second S/D region to the second gate region, and wherein the third electrically conducting line electrically couples the fourth S/D region to the second discharge prevention semiconductor region.

The present invention provides a hybrid-orientation substrate structure (and a method for forming the same) with discharge prevention features.

DETAILED DESCRIPTION OF THE INVENTION

Figure 1:
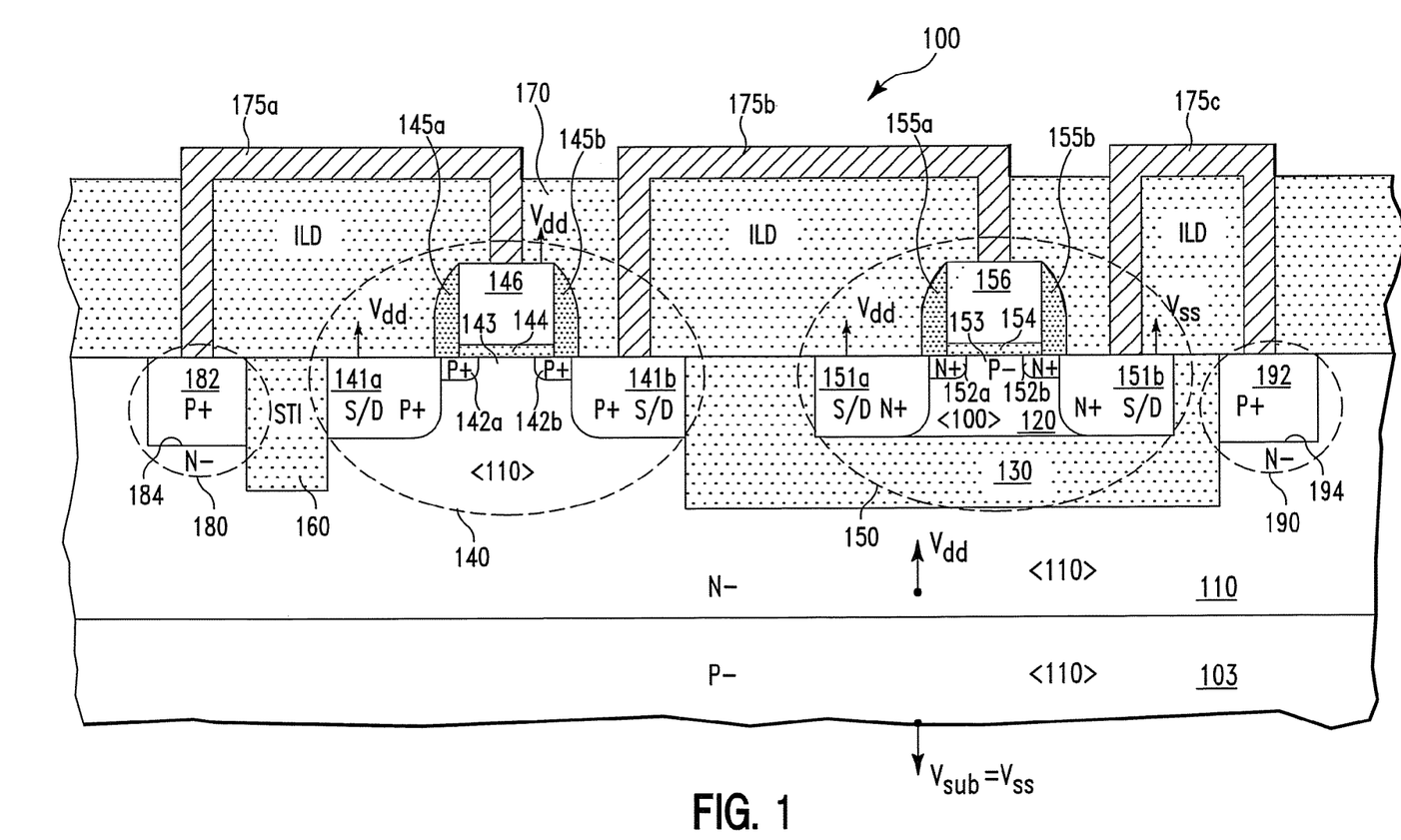
FIGS. 1-2 illustrate cross-section views of two different hybrid-orientation substrate structures, in accordance with embodiments of the present invention.
Figure 2:
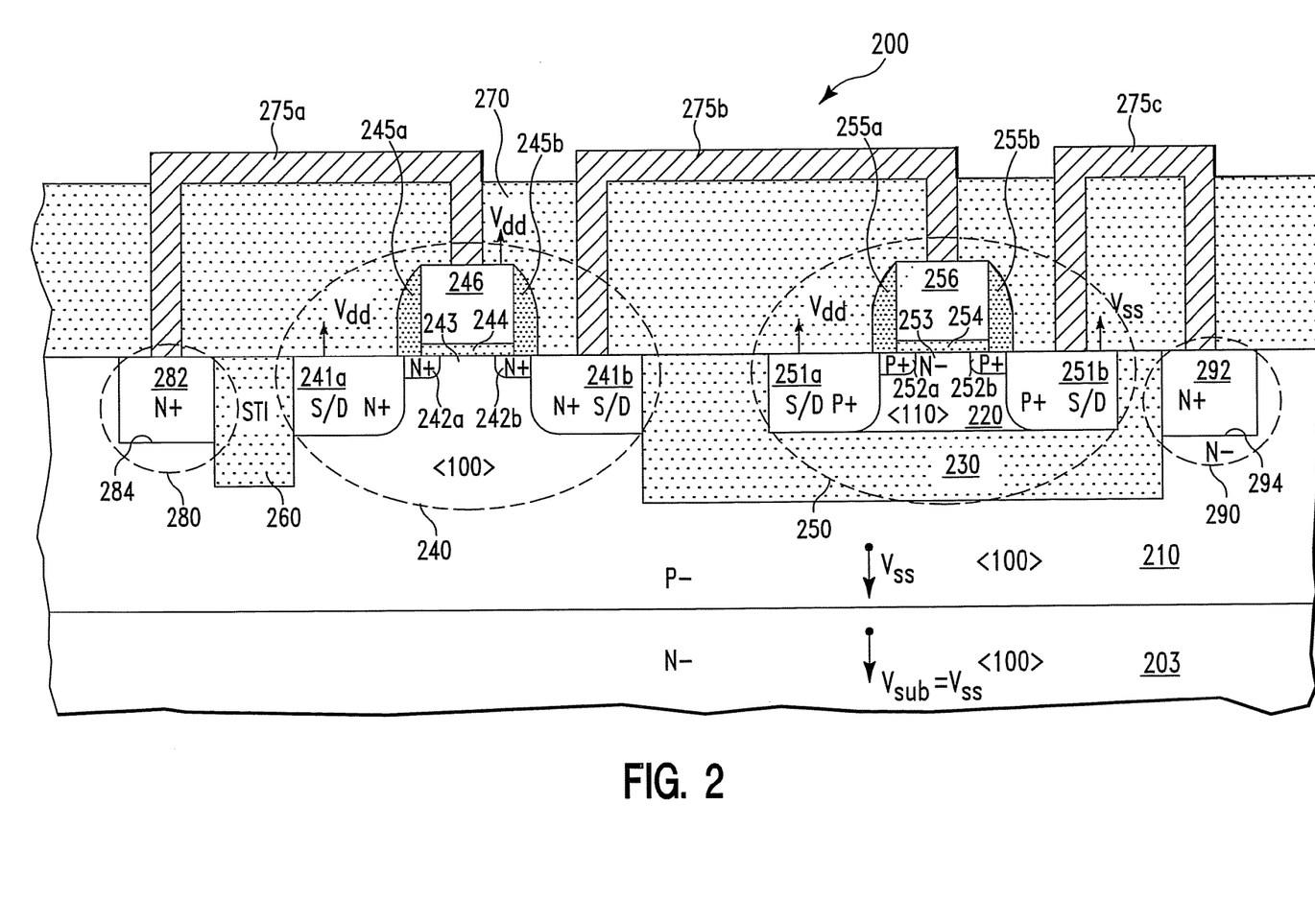

FIGS. 1-2 illustrate cross-section views of two different hybrid-orientation substrate structures 100 and 200, respectively, in accordance with embodiments of the present invention. More specifically, with reference to FIG. 1, in one embodiment, the hybrid-orientation substrate structure 100 comprises a semiconductor N− well 110 of <110> silicon (i.e., silicon that has <110> lattice orientation) formed on a semiconductor substrate 103 of <110> silicon. The structure 100 further comprises a P− semiconductor region 120 of <100> silicon (i.e., silicon that has <100> lattice orientation). The silicon region 120 is physically and electrically isolated from the silicon N− well 110 by a dielectric region 130. In one embodiment, the dielectric region 130 comprises silicon dioxide. The structure 100 further comprises (i) a P channel field effect transistor (PFET) 140 on the N− well 110 and (ii) an N channel FET (NFET) 150 on the semiconductor region 120.

Illustratively, the PFET 140 comprises a channel region 143 disposed between and in direct physical contact with two source/drain (S/D) extension regions 142a and 142b. The S/D extension regions 142a and 142b are in direct physical contact with S/D regions 141a and 141b, respectively. The S/D extension regions 142a and 142b and the S/D regions 141a and 141b are doped with P type dopants (such as boron atoms) at a doping concentration of about $10^{20}$ atoms/cm³. The PFET 140 further comprises a gate dielectric region 144 and a gate region 146 that is electrically insulated from the channel region 143 by the gate dielectric region 144. The PFET 140 further comprises gate spacers 145a and 145b (comprising silicon nitride in one embodiment) on side walls of the gate region 146.

In one embodiment, the NFET 150 has a structure similar to that of the PFET 140, except that the doping polarity is opposite. More specifically, the NFET 150 comprises a channel region 153 disposed between and in direct physical contact with two S/D extension regions 152a and 152b. The S/D extension regions 152a and 152b are in direct physical contact with S/D regions 151a and 151b, respectively. The S/D extension regions 152a and 152b and the S/D regions 151a and 151b are doped with N type dopants (such as arsenic atoms) at a doping concentration of about $10^{20}$ atoms/cm³. The NFET 150 further comprises a gate dielectric region 154 and a gate region 156 that is electrically insulated from the channel region 153 by the gate dielectric region 154. The NFET 150 further comprises gate spacers 155a and 155b (comprising silicon nitride in one embodiment) on side walls of the gate region 156.

In one embodiment, the structure 100 further comprises a shallow trench isolation (STI) region 160. Illustratively, the STI region 160 comprises silicon dioxide.

In one embodiment, the structure 100 further comprises metal lines 175a, 175b, and 175c formed on and in an inter-level dielectric (ILD) layer 170. The metal line 175a electrically couples the gate region 146 to a discharge prevention structure 180. In one embodiment, the discharge prevention structure 180 comprises a P+ region 182 in the N− well 110. In one embodiment, the metal line 175b electrically couples the gate region 156 of the NFET 150 to the S/D region 141b of the PFET 140. The metal line 175c electrically couples the S/D region 151b of the NFET 150 to a discharge prevention structure 190. In one embodiment, the discharge prevention structure 190 comprises a P+ region 192 in the N− well 110.

The operations of the discharge prevention structures 180 and 190 are as follows. After the metal lines 175a, 175b, and 175c are formed, additional fabrication steps are needed to complete the structure 100 (e.g., more interconnect levels may be formed). During these additional fabrication steps, if a plasma process is involved, then the discharge prevention structures 180 and 190 help prevent discharge damage to the FETs 150 and 160, respectively, caused by such a plasma process.

More specifically, during the plasma process, all the doped semiconductor regions (whether doped P or N type) become electrically conducting due to the effect of the plasma. As a result, all the semiconductor regions of the FETs 150 and 160 are electrically connected to the N− well 110. In other words, all the semiconductor regions of the FETs 150 and 160 are at the same voltage potential as that of the N− well 110.

For instance, the semiconductor regions 141a, 141b, 142a, and 142b of the FET 140 are in direct physical contact with the N− well 110 and therefore are at the same voltage potential as that of the N− well 110 during the plasma process. The gate region 146 of the FET 140 is electrically connected to the N− well 110 via the metal line 175a and the P+ doped semiconductor region 182, and therefore is also at the same voltage potential as that of the N− well 110 during the plasma process.

Similarly, the semiconductor regions 151a, 151b, 152a, 152b, and 120 of the FET 150 are electrically connected to the N− well 110 via the metal line 175c and the P+ semiconductor region 192, and therefore are at the same voltage potential as that of the N− well 110 during the plasma process. Also, the gate region 156 of the FET 150 is electrically connected to the N− well 110 via the metal line 175b and the P+ semiconductor region 141b, and therefore is at the same voltage potential as that of the N− well 110 during the plasma process.

As a result of all the semiconductor regions of the FETs 140 and 150 being at the same voltage potential as that of the N− well 110, there is no current discharge between different semiconductor regions of the FETs 140 and 150, hence no discharge damage, even if the plasma of the plasma process is at a different voltage potential than that of the N− well 110 (which is usually the case).

Assume that the metal lines 175a and 175c were omitted from the structure 100 of FIG. 1. As a result, without the metal line 175a, during the plasma process, the gate region 146 of the FET 140 would be floating and might be charged to the voltage potential of the plasma. Therefore, there might be current discharge between the gate region 146 and the N− well 110 through the gate dielectric region 144 causing discharge damage to the gate dielectric region 144 if the plasma is at a voltage potential substantially different than that of the N− well 110.

Similarly, without the metal line 175c, during the plasma process, the semiconductor region 120 would be floating and might be charged to the voltage potential of the plasma, while the gate region 156 is at the same voltage potential as that of the N− well 110. Therefore, there might be current discharge between the gate region 156 and the semiconductor region 120 via the gate dielectric region 154, causing discharge damage to the gate dielectric region 144, if the plasma is at a voltage potential substantially different than that of the N− well 110.

From the description above, the discharge prevention structures 180 and 190 (comprising doped semiconductor materials) and the metal lines 175a and 175b help ensure that all semiconductor regions of the FETs 140 and 150 be electrically coupled to the N− well 110 during a plasma process so as to prevent current discharge through the gate dielectric regions 144 and 154 of the FETs 140 and 150, respectively.

In one embodiment, during the normal operation of the structure 100, the FETs 140 and 150 are operated between voltage potentials Vdd and Vss (wherein Vdd>Vss) while the N− well 110 is coupled to a voltage potential Vdd, and the P− substrate 103 is coupled to Vsub (which is equal to Vss in one embodiment). For example, Vdd and Vss may be 1.8V and 0V, respectively and may be applied to different nodes of the structure 100 of FIG. 1 as shown. As a result, the P+N− junctions 184 and 194 of the discharge prevention structures 180 and 190, respectively, are reverse-biased and therefore behave like dielectric regions. As a result, the operation of the FETs 150 and 160 are not affected by the presence of the discharge prevention structures 180 and 190, respectively.

In summary, the discharge prevention structures 180 and 190, and the metal lines 175a and 175c help prevent discharge damage to the FETs 140 and 150 during a plasma process, while do not interfere with the normal operation of the FETs 140 and 150.

FIG. 2 illustrates a cross-section view of another hybrid-orientation substrate structure 200, in accordance with embodiments of the present invention. In one embodiment, the structure 200 is similar to the structure 100 of FIG. 1, except that (i) the lattice orientations of the well 210 and the semiconductor region 220 are <100> and <110>, respectively, and (ii) the doping polarities of all the doped semiconductor regions are changed to the opposite.

For simplicity, all reference numerals have three numeral digits starting with the figure number. In addition, similar regions have the same reference numeral except for the first digit which is used to indicate the figure number. For example, the well 110 (FIG. 1) and the well 210 (FIG. 2) are similar.

The operations of the discharge prevention structures 280 and 290 are similar to those of the discharge prevention structures 180 and 190 (FIG. 1), respectively, except that during the normal operation of the structure 200, the FETs 240 and 250 are operated between voltage potentials Vdd and Vss (wherein Vdd>Vss) while the well 210 is coupled to Vss and the substrate 203 is coupled to a voltage potential Vsub (wherein Vsub=Vss in one embodiment). For example, Vdd and Vss can be 1.8V and 0V, respectively, and may be applied to different nodes of the structure 200 of FIG. 2 as shown.

More specifically, during a plasma process, the discharge prevention structures 280 and 290 and the metal lines 275a and 275b help ensure that all semiconductor regions of the FETs 240 and 250 be electrically coupled to the well 210 during the plasma process so as to prevent current discharge through the gate dielectric regions 244 and 254 of the FETs 240 and 250, respectively. During the normal operation of the structure 200, the discharge prevention structures 280 and 290 are reverse-biased and therefore behave like dielectric regions. As a result, the operation of the FETs 240 and 250 are not interfered by the presence of the discharge prevention structures 280 and 290, respectively.

Figure 3:
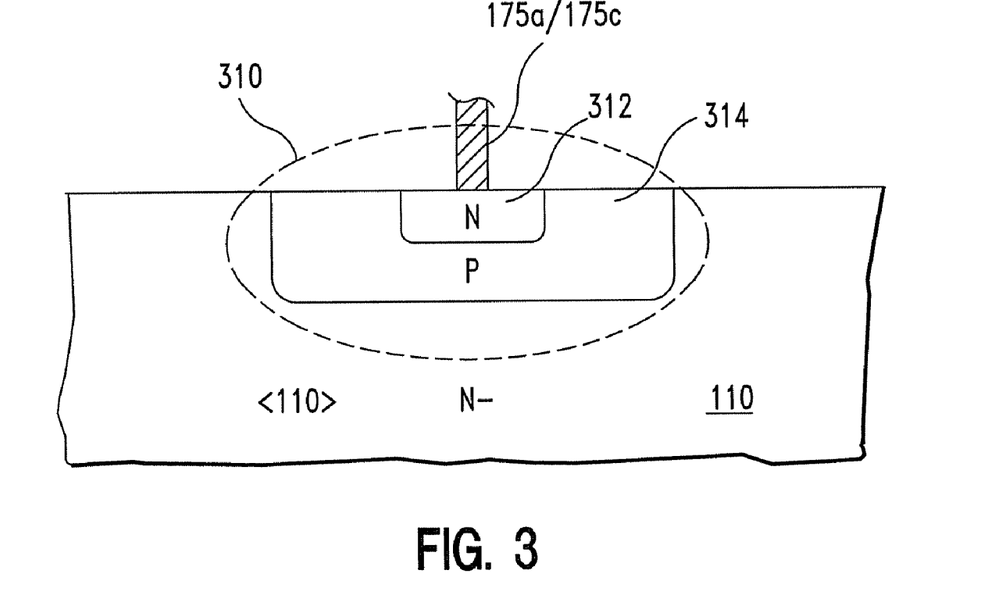
FIG. 3 illustrates a cross-section view of an additional embodiment of the discharge prevention structures of FIG. 1, in accordance with embodiments of the present invention.

FIG. 3 illustrates a cross-section view of a discharge prevention structure 310, which can be used in place of either or both of the discharge prevention structures 180 and 190 of FIG. 1. The discharge prevention structures 310 comprises, illustratively, (i) an N semiconductor region 312 in direct physical contact with the metal line 175a/175c and (ii) a P semiconductor region 314 which physically isolates the N semiconductor region 312 from the N− well 110. In essence, the discharge prevention structures 310 comprises two back-to-back PN junctions one of which is reverse-biased whenever there is a voltage difference between the metal line 175a/175c and the well 110. Therefore, if the FETs 140 and 150 (FIG. 1) are operated between Vdd and Vss and if the voltage potential Vw of the well 110 is not too far away from Vdd and Vss (i.e., the larger of |Vdd−Vw| and |Vss−Vw| is not greater than the break down voltage of the two back-to-back PN junctions of the discharge prevention structures 310), then the discharge prevention structures 310 behaves like a dielectric region and therefore does not interfere with the operation of the FETs 140 and 150 (FIG. 1).

However, during a plasma process, the discharge prevention structures 310 becomes electrically conducting and therefore helps ensure that, with reference to FIG. 1, all semiconductor regions of the FETs 140 and 150 be electrically coupled to the well 110 during the plasma process so as to prevent current discharge through the gate dielectric regions 144 and 154 of the FETs 140 and 150, respectively.

Figure 4:
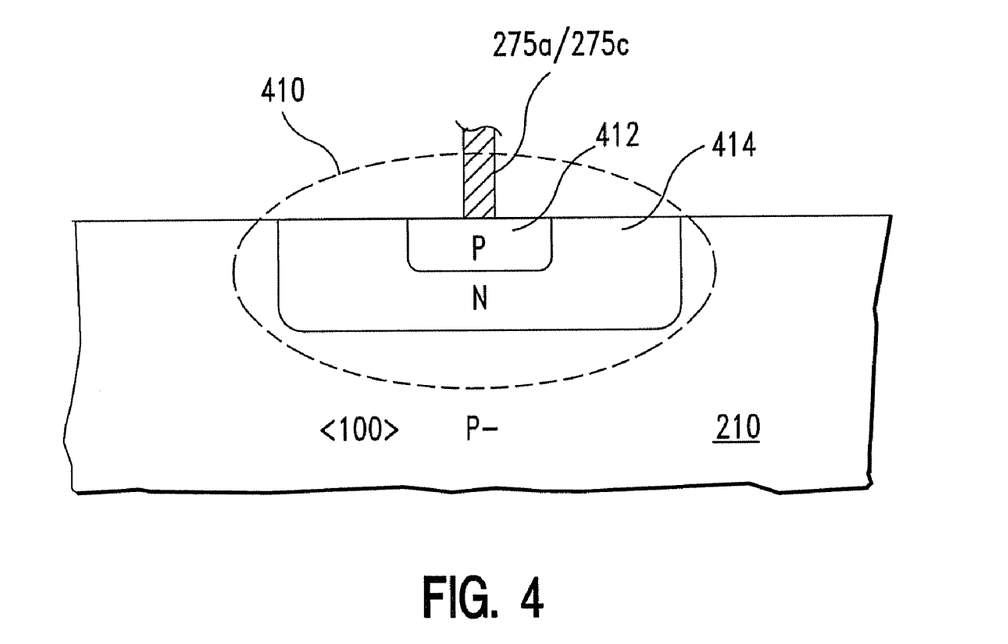
FIG. 4 illustrates a cross-section view of an additional embodiment of the discharge prevention structures of FIG. 2, in accordance with embodiments of the present invention

FIG. 4 illustrates a cross-section view of a discharge prevention structure 410, which can be used in place of either or both of the discharge prevention structures 280 and 290 of FIG. 2. The discharge prevention structures 410 comprises, illustratively, (i) a P semiconductor region 412 in direct physical contact with the metal line 275a/275c and (ii) an N semiconductor region 414 which physically isolates the P semiconductor region 412 from the P− well 210. In essence, the discharge prevention structures 410 comprises two back-to-back PN junctions one of which is reverse-biased whenever there is a voltage difference between the metal line 275a/275c and the well 210. Therefore, if the FETs 240 and 250 (FIG. 2) are operated between Vdd and Vss and if the voltage potential Vw of the well 210 is coupled to Vsub which is not too far away from Vdd and Vss (i.e., the larger of |Vdd−Vw| and |Vss−Vw| is not greater than the break down voltage of the two back-to-back PN junctions of the discharge prevention structures 410), then the discharge prevention structures 410 behaves like a dielectric region and therefore does not interfere with the operation of the FETs 240 and 250 (FIG. 2).

However, during a plasma process, the discharge prevention structures 410 becomes electrically conducting and therefore helps ensure that, with reference to FIG. 2, all semiconductor regions of the FETs 240 and 250 be electrically coupled to the well 210 during the plasma process so as to prevent current discharge through the gate dielectric regions 244 and 254 of the FETs 240 and 250, respectively.

With reference to FIG. 1, in an alternative embodiment, the metal line 175b electrically couples the S/D region 151a of the NFET 150 to the S/D region 141b of the PFET 140. The metal line 175c electrically couples the gate region 156 of the NFET 150 to the discharge prevention structure 190. In this embodiment, discharge damage to the gate dielectric region 154 is also prevented during a plasma process, whereas later the normal operation of the FET 150 is not interfered.

FIGS. 5A-5E illustrates fabrication steps for forming the hybrid-orientation substrate structure 100 of FIG. 1, in accordance with embodiments of the present invention. More specifically, with reference to FIG. 5A, the fabrication steps start with a double SOI (silicon on insulator) structure 100. The double SOI structure 100 illustratively comprises an N-<110> silicon well 110' on a P-<110> silicon substrate 103, a dielectric layer 130', a P-<100> silicon layer 120', an oxide layer 510, and a nitride layer 520. In one embodiment, the double SOI structure 100 is formed using a conventional double SOI process.

Figure 5A:
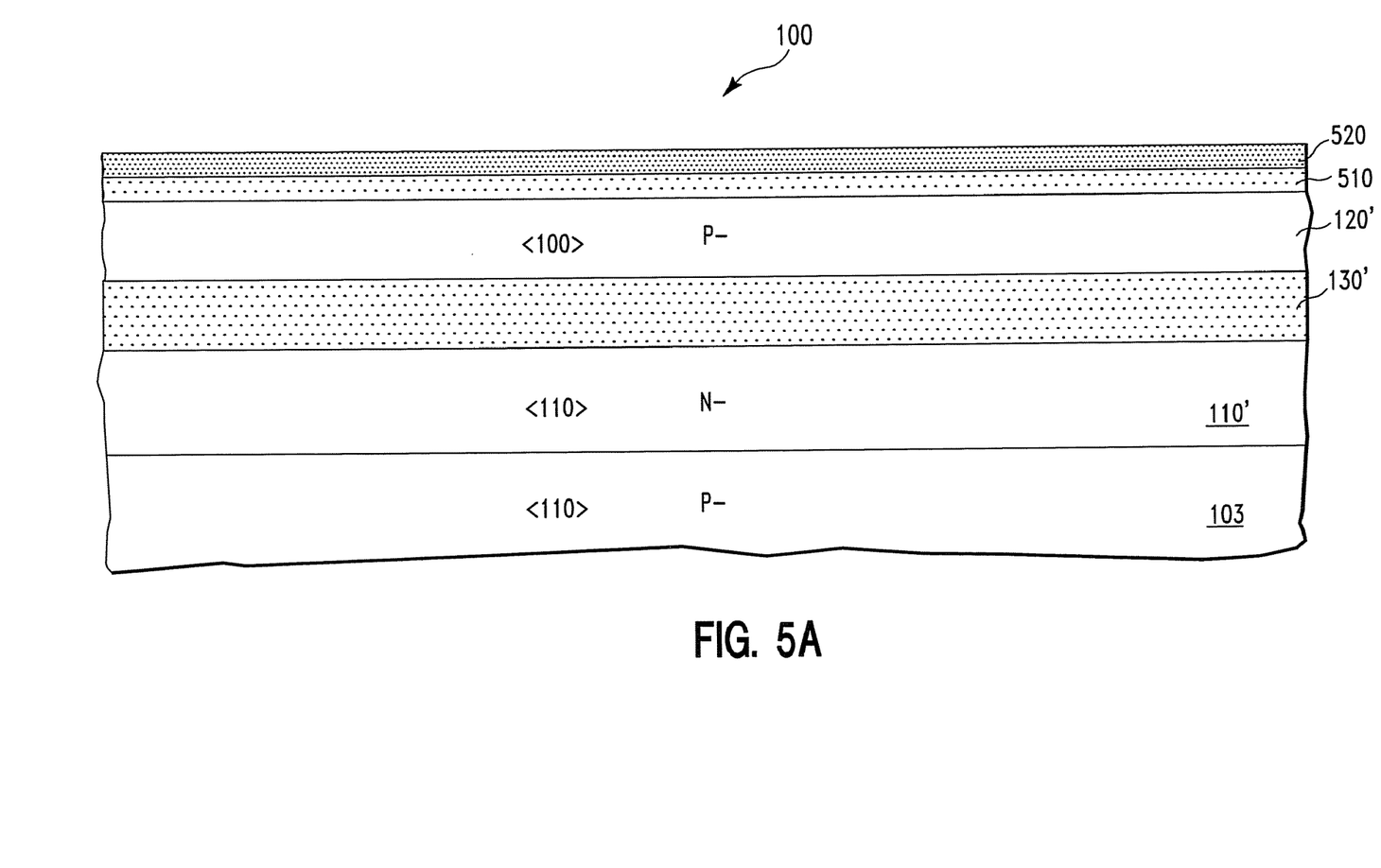
FIGS. 5A-5E illustrates the fabrication steps for forming the hybrid-orientation substrate structure of FIG. 1, in accordance with embodiments of the present invention.
Figure 5B:
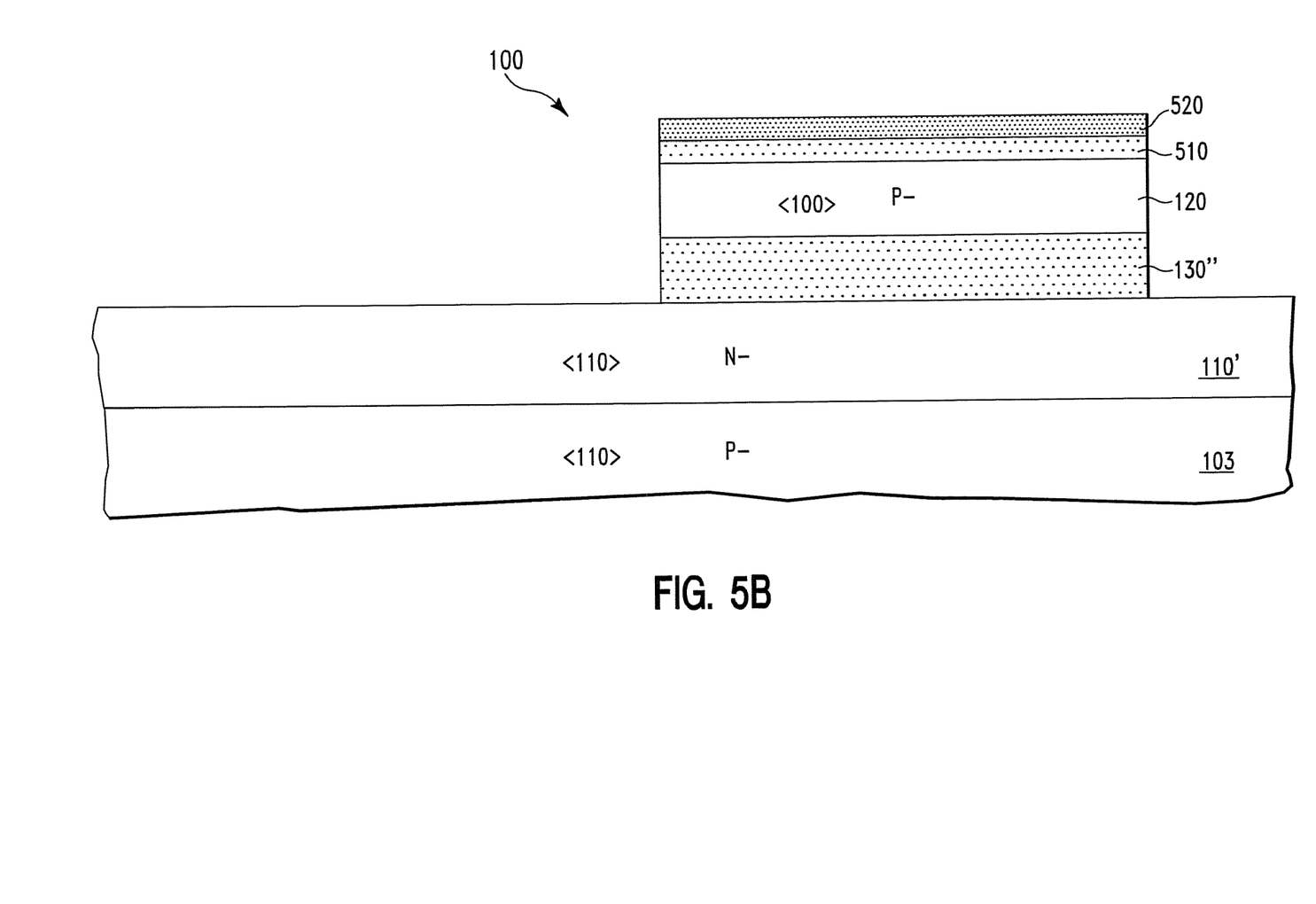

Next, with reference to FIG. 5B, in one embodiment, portions of the layers 520, 510, 120', and 130' of FIG. 1 are etched stopping at the well 110', using any conventional photolithographic process, resulting in the structure 100 as shown in FIG. 5B. What remain of the silicon layer 120' and the dielectric layer 130' (FIG. 1) become the silicon region 120 and the dielectric region 130, respectively.

Figure 5C:
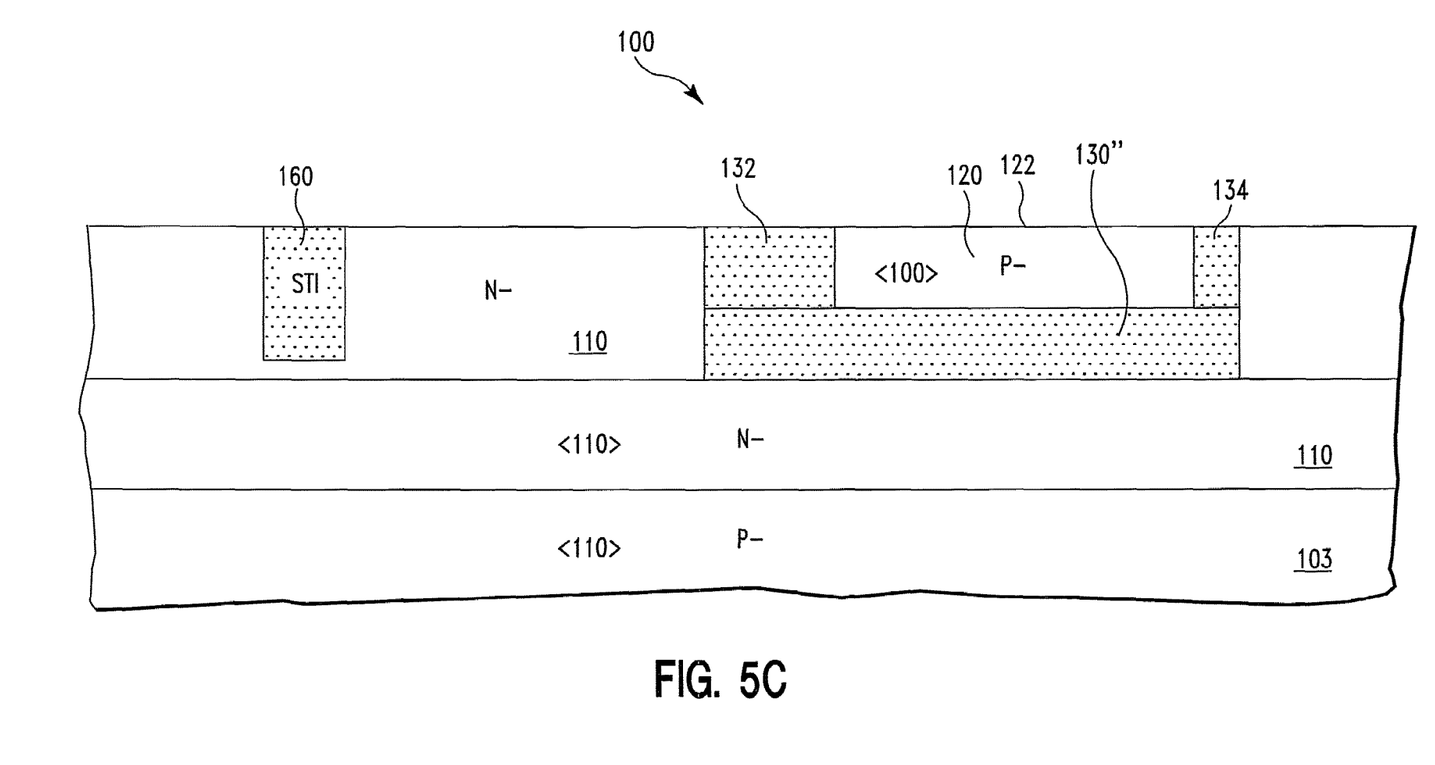

Next, with reference to FIG. 5C, in one embodiment, silicon is epitaxially grown from the well 110' (FIG. 1) to a level higher than a top surface 122 of the silicon region 120, and then a chemical mechanical polishing (CMP) step is performed until the top surface 122 of the silicon region 120 is exposed to the surrounding ambient, resulting in the well 110. The epitaxially grown silicon merges with the well 110' (FIG. 1) to become the well 110.

Next, the STI 160 is formed in the well 110, while the dielectric regions 132 and 134 are formed in the silicon region 120. The dielectric regions 132 and 134 merge with the dielectric region 130' resulting in the dielectric region 130 (FIG. 1).

Figure 5D:
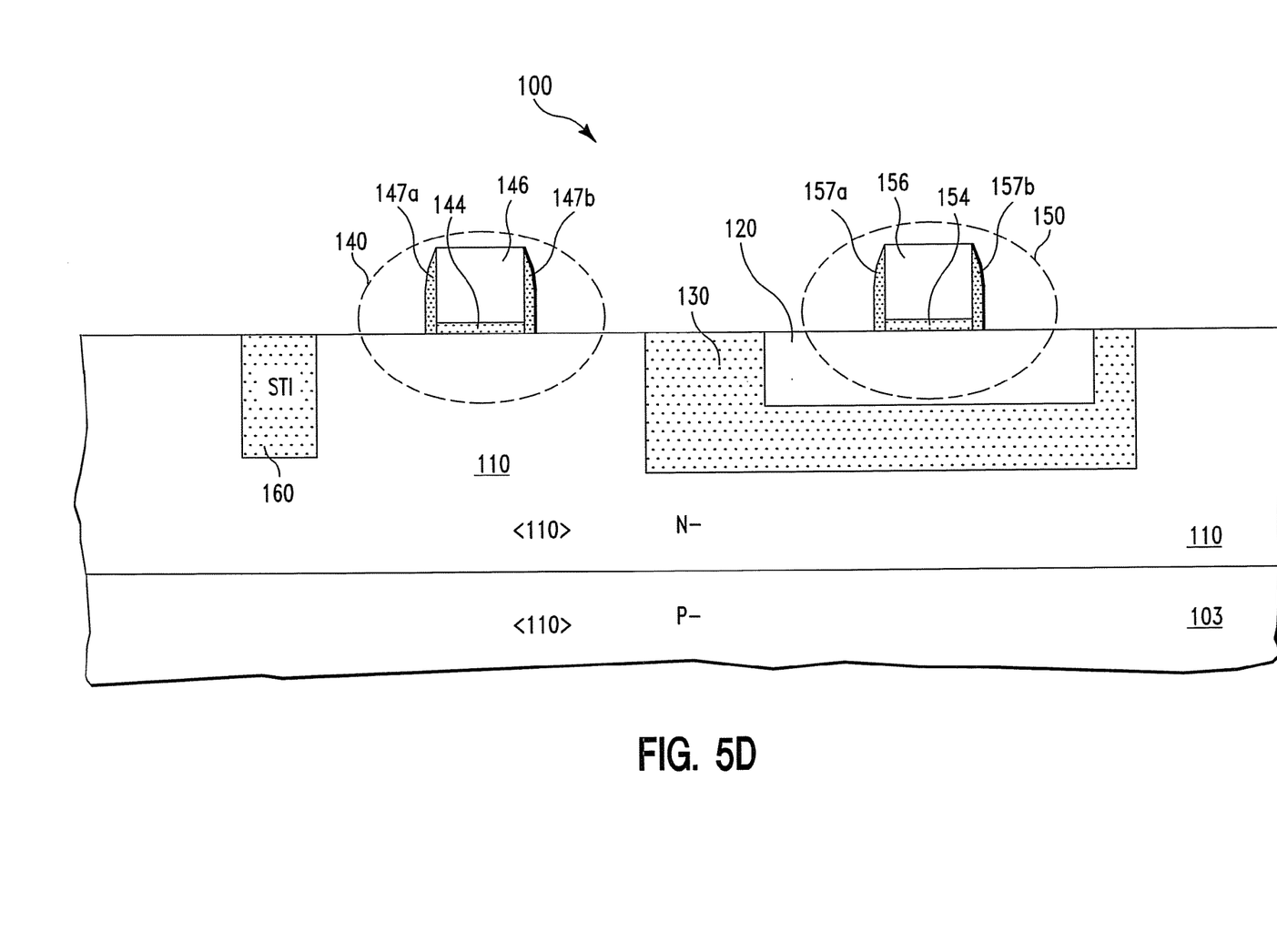

Next, with reference to FIG. 5D, in one embodiment, the gate stack 144,146 of the FET 140 and the gate stack 154,156 of the FET 150 are formed using any conventional process. Next, extension spacers 147a and 147b (comprising silicon nitride in one embodiment) are formed on side walls of the gate stack 144,146, while extension spacers 157a and 157b (comprising silicon nitride in one embodiment) are formed on side walls of the gate stack 154,156, using any conventional method.

Figure 5E:
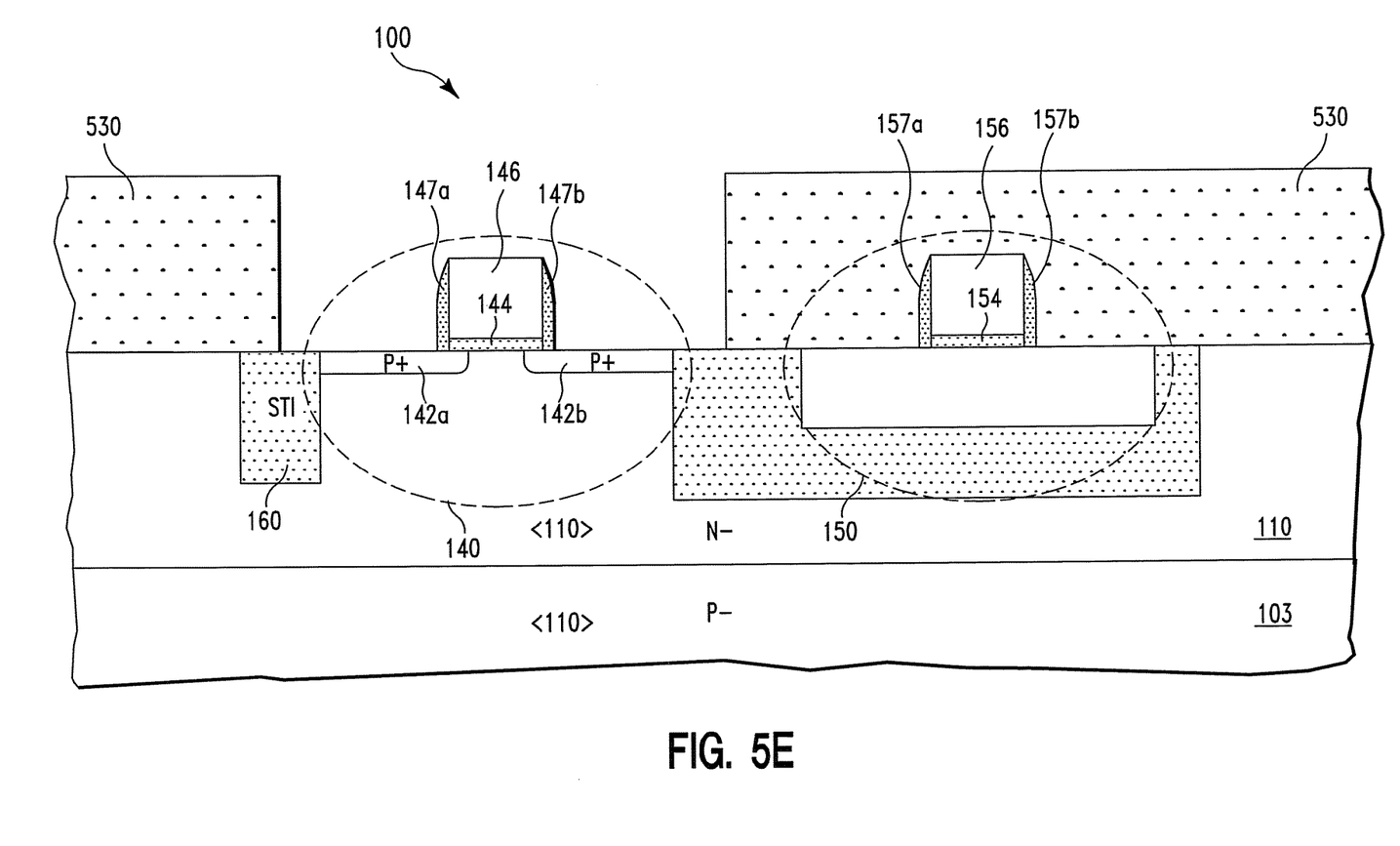

Next, with reference to FIG. 5E, in one embodiment, a patterned photoresist layer 530 is formed on top of the entire structure 100 of FIG. 5D except semiconductor regions to be doped P type. Next, the P+ extension regions 142a and 142b are formed by any conventional method (e.g., ion implantation), and then the patterned photoresist layer 530 is removed using any conventional method (e.g., plasma etch). It should be noted that the extension regions 142a and 142b will have their final size and shape as shown in FIG. 1.

Next, another patterned photoresist layer (not shown) is formed on top of the entire structure 100 except semiconductor regions to be doped N type. Next, N+ extension regions (not shown, but similar to the P+ extension regions 142a and 142b, and eventually become the N+ extension regions 152a and 152b of FIG. 1) are formed by any conventional method (e.g., ion implantation), and then the patterned photoresist layer is removed using any conventional method (e.g., plasma etch).

Next, with reference to FIG. 1, in one embodiment, the spacers 145a, 145b, 155a, and 155b are formed using any conventional method. Then, a patterned photoresist layer (not shown) is formed on top of the entire structure 100 except semiconductor regions to be doped P type. Next, the P+ regions 141a, 141b, 182, and 192 are formed using any conventional method (e.g., ion implantation), and then the patterned photoresist layer is removed using any conventional method (e.g., plasma etch).

Next, in one embodiment, a patterned photoresist layer (not shown) is formed on top of the entire structure 100 except semiconductor regions to be doped N type. Next, the N+ S/D regions 151a and 151b are formed using any conventional method (e.g., ion implantation), and then the patterned photoresist layer is removed using any conventional method (e.g., plasma etch).

Next, the ILD layer 170 is formed on top of the entire structure 100 by, illustratively, chemical vapor deposition (CVD). Next, metal lines 175a, 175b, and 175c are formed using any conventional method (e.g., forming contact holes in the ILD 170, then filling the contact holes with a metal, and then forming a patterned metal layer on top of the ILD 170 connecting the contact holes resulting in the metal lines 175a, 175b, and 175c).

If the discharge prevention structure 310 (FIG. 3) is used in the structure 100 of FIG. 1 in place of the discharge prevention structure 180 and/or 190, the formation of the structure 100 of FIG. 1 is similar to that described above. More specifically, during the formation of the FET 140, the P region 314 (FIG. 3) and the P regions 141a and 141b may be formed simultaneously. Then later, during the formation of the FET 150, the N region 312 (FIG. 3) and the N regions 151a and 151b may be formed simultaneously.

Similarly, with reference to FIG. 2, if the discharge prevention structure 410 (FIG. 4) is used in the structure 200 in place of the discharge prevention structure 280 and/or 290, the formation of the structure 200 is similar to that described above. More specifically, during the formation of the FET 240, the N region 414 (FIG. 4) and the N regions 241a and 241b may be formed simultaneously. Then later, during the formation of the FET 250, the P region 412 (FIG. 4) and the P regions 251a and 251b may be formed simultaneously.

In the embodiments described above, each of the regions 110 and 120 (FIG. 1) and the regions 210 and 220 (FIG. 2) comprises silicon having a lattice orientation of either <100> or <110>. In general, each of the regions 110, 120, 210, and 220 can comprise silicon (or any other semiconductor material such as germanium, etc.) having a lattice orientation of <100>, <110>, <111>, <211>, <311>, <511>, or <711>.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

The invention is claimed:

1. A semiconductor structure fabrication method, comprising:

provide a semiconductor structure comprising:

(a) a semiconductor block comprising a first semiconductor material doped with a first doping polarity and having a first lattice orientation;

(b) a semiconductor region on the semiconductor block, wherein the semiconductor region is physically isolated from the semiconductor block by a dielectric region, and wherein the semiconductor region comprises a second semiconductor material (i) doped with a second doping polarity opposite to the first doping polarity and (ii) having a second lattice orientation different from the first lattice orientation;

forming first and second gate stacks on the semiconductor block and the semiconductor region, respectively, wherein the first and second gate stacks comprises first and second gate regions, respectively;

simultaneously forming (i) first and second S/D regions in the semiconductor block on opposing sides of the first gate stack and (ii) first and second discharge prevention semiconductor regions in the semiconductor block, wherein the first and second S/D regions and the first and second discharge prevention semiconductor regions are doped with the second doping polarity;

forming third and fourth S/D regions in the semiconductor region on opposing sides of the second gate stack, wherein the third and fourth S/D regions are doped with the first doping polarity; and forming first, second, and third electrically conducting lines, wherein the first electrically conducting line electrically couples the first gate region to the first discharge prevention semiconductor region, wherein the second electrically conducting line electrically couples the second S/D region to the second gate region, and wherein the third electrically conducting line electrically couples the fourth S/D region to the second discharge prevention semiconductor region.

2. The method of claim 1,
wherein the first and second semiconductor materials comprises silicon, and
wherein the first and second doping polarities are N and P types, respectively.

3. The method of claim 1,
wherein the first and second semiconductor materials comprises silicon, and
wherein the first and second doping polarities are P and N types, respectively.

4. The method of claim 1,
wherein the first and second semiconductor materials comprise silicon,
wherein the first lattice orientation is selected from the group consisting of <100> and <110>, and
wherein the second lattice orientation is selected from the group consisting of <100> and <110>.

5. The method of claim 1,
wherein the first and second doping polarities are N and P types, respectively, and
wherein the first and second lattice orientations are <110> and <100>, respectively.

* * * * *